United States Patent [19]

Ageishi et al.

[11] Patent Number: 4,935,774
[45] Date of Patent: Jun. 19, 1990

[54] METHOD AND AN APPARATUS FOR PERFORMING THREE-DIMENSIONAL EXPOSURE

[75] Inventors: Yukihiro Ageishi, Kawasaki; Kaihei Isshiki, Atsugi, both of Japan

[73] Assignee: Ricoh Company, Ltd., Tokyo, Japan

[21] Appl. No.: 342,087

[22] Filed: Apr. 24, 1989

[30] Foreign Application Priority Data

Apr. 23, 1988 [JP] Japan ................................ 63-100665

[51] Int. Cl.$^5$ ............................................ G03B 27/22
[52] U.S. Cl. ........................................ 355/104; 355/49
[58] Field of Search ............... 355/104, 105, 108, 110, 355/52, 49, 117, 52

[56] References Cited

U.S. PATENT DOCUMENTS

| | | | |
|---|---|---|---|
| 3,314,329 | 4/1967 | Wolbert | 355/52 X |
| 3,627,412 | 12/1971 | Jean | 355/49 X |
| 3,785,819 | 1/1974 | Barnes, Jr. et al. | 355/49 X |
| 4,102,734 | 7/1978 | Schiffman | 355/49 X |
| 4,119,484 | 10/1978 | Schiffman | 355/49 X |

*Primary Examiner*—Richard A. Wintercorn
*Attorney, Agent, or Firm*—Oblon, Spivak, McClelland, Maier & Neustadt

[57] ABSTRACT

A method and an apparatus by use of three-dimensional photo-lithographic exposure employed for transferring an image to a recording medium among a series of processing works of practicing groove-processing, etc., corresponding to the image by utilization of photo-etching technology or the like, the apparatus for performing three-dimensional exposure comprising an optical unit, a work gripping assembly, a work moving mechanism, a control unit, and a main body frame, and the optical unit comprising a light source portion, a lens portion, and a reflection mirror, wherein the ultraviolet rays focused by the reflection mirror through a slit of a photo-mask onto a photo-sensitive coating film formed on an outer surface of a work loosely inserted into the through-hole of the reflection mirror together with a photo-mask surrounding an outer circumference of the work.

21 Claims, 8 Drawing Sheets

METHOD AND AN APPARATUS FOR PERFORMING THREE-DIMENSIONAL EXPOSURE

BACKGROUND OF THE INVENTION

1. Field of the Invention:

The present invention relates to a method of performing three-dimensional exposure and an apparatus for performing three-dimensional exposure, for instance, to a method and an apparatus by use of three-dimensional photolithography employed for transferring an image to a recording medium among a series of processing works of practicing groove-processing, etc., corresponding to the image by utilization of photo-etching technology or the like.

2. Description of the Prior Art:

Generally, in the groove processing technology of a non-contact axis employed for making hydrodynamic gas bearing, or in the etching technology of processing a cap of fountain pen, a photo-sensitive coating film, that is, a photo-resist coating film is formed on a surface to be three-dimensionally-processed, and thereafter the photo-sensitive coating film is exposed to the ultraviolet rays through an image carrying film or a mask. Conventionally, various sorts of three-dimensional exposing method have been adopted for transferring an image of predetermined shape onto a surface to be processed, and various sorts of three-dimensional exposing device have been employed corresponding thereto.

As to such conventional sorts of three-dimensional exposing method and apparatus, there are several prior art documents. For instance, the conventional sorts of three-dimensional exposing method and apparatus are described in "A Three-dimensional Optical Device" by D. M. Allen, et al. (Annals of the CIRP Vol. 36/1/1987); a published specification of Japanese laid-open patent application, Tokkaisho 52-11143/1977(SHOWA); and "A Gas Bearing—from designing to manufacturing" by Shinichi Tohgoh, published on Dec. 25, 1984.

A cylindrical work constructs an axis portion of the afore-mentioned hydrodynamic gas bearing, and a photo-sensitive coating film is formed on the outer circumference of the cylindrical work. A mask closely surrounds the outer circumference of the work holding the photo-sensitive coating film therebetween. An image to be transferred to the photo-sensitive coating film is formed on the photo-mask. A mercury-vapor lamp is employed as an exposure light source. Ultraviolet rays emitted from the mercury-vapor lamp pass through a convex lens and are converted to parallel light rays, and a part of the parallel light rays is projected onto the photo-mask through a slit of a light intercepting plate disposed between the convex lens and the work. On the other hand, the work rotates around the axis of the work together with the photo-mask. The photo-sensitive coating film of the work is exposed in order to the photo-sensitive coating film through the image of the photo-mask. In such a way, the image on the photo-mask is transferred onto the photo-sensitive coating film 2.

Hereupon, such exposing method is called "a slit exposing method", and the necessary exposing time Tcyl of the cylindrical body can be expressed by the following equation:

$$Tcyl = \frac{\pi D}{W} \cdot Tp \tag{1}$$

Here, Tp, D and W respectively signify as follows:
  Tp; Adequate Exposure Time of Photo-Resist formed on the Surface of the Photo-Sensitive Coating Film 2
  D; Outer Diameter of a Cylindrical Body formed by the Photo-Sensitive Coating Film 2
  W; Width of the slit 7

Next, the afore-mentioned second embodiment of the prior art is a modification of the slit-exposure method shown in the first embodiment of the prior art. In the second embodiment, such apparatus performing slit-exposure is constructed such that an image-carrying film is transported sideways along the light intercepting plate through the gap between the light intercepting plate and the work, and the work is synchronously rotated so as to allow the circumferential speed of the work to coincide with the transporting speed for the image film. And further, a cylindrical cover is tightly attached to the outer circumference of the work so as to come into close contact therewith and fixed on the outer circumference thereof, and the slit of the light intercepting plate and the slit of the cover are made to coincide with each other on the optical axis of the parallel light rays in order to prevent the light rays from scattering at the time of exposure. And further, in the third embodiment of the prior art, a comparatively simple exposure method is practiced, e.g., a photo-sensitive coating film is formed on the surface of a platestate work, and a photo-mask having a predetermined image developed thereon is brought into close contact with the surface of the work, and further exposure is done by directly radiating the ultraviolet rays from the light source.

However, in such conventional three-dimensional methods and apparatuses, since the time of exposure is long in all cases and further the preparatory works performed before exposure mainly consist of manual operation, improvement of processing accuracy for manufacturing the products needs a high degree of skill and preparatory works expend a long time. For this reason, the efficiency of such works is lowered and it results in cost-up of the products in its turn. Those matters are thought to be defects of the conventional technology.

Namely, in the first embodiment of prior art, the afore-mentioned equation (1) shows that, in the case of employing same photo-resist(s) and presuming the outer diameter D of the photo-sensitive coating cylindrical body to be constant, the time period of exposure Tcyl is determined in the first meaning in accordance with the width of the slit formed in the light intercepting plate, and when the width of the slit is made narrower for the purpose of improving the quality of products with a high exposure accuracy, the time period of exposure is made extraordinarily long, for instance, it needs to take about thirty minutes for exposing one work. Furthermore, when the photo-mask is attached to the work, image of the photo-mask is positioned in relation to the work and the photo-mask is wound therearound. After finishing to attach the photo-mask to the work, the former has to be brought into close contact with the latter. Therefore, the preparatory works needed a high degree of skill and long time period. And further, even in the second and third embodiments of prior art, the exposure time is long on both occasions. Especially, in the third embodiment, the exposure per one work needs a considerably long time, for instance, twenty minutes. Furthermore, although an exposure method employing a laser beam has been already proposed for shortening the exposure time while keeping the exposure accuracy high, the control method is complicated and the cost of the device is high. Those matters are defects of the prior art not yet solved completely.

SUMMARY OF THE INVENTION

It is an object of the present invention to solve the afore-mentioned matters on the background of the technical problems to be improved.

It is another object of the present invention to provide a method and an apparatus for automatically performing three-dimensional exposure without requiring preparatory works of unnecessary high degree of skill and a long time period to be taken for the preparatory works.

It is still another object of the present invention to shorten the exposure time.

It is still another object of the present invention to enable improvement of the working efficiency.

It is still another object of the present invention to realize cost-down of the product.

Other objects and features of the present invention will be apparent from the following detailed description and claims in accordance with the accompanying drawings.

DESCRIPTION OF THE PREFERRED EMBODIMENTS

Preferred embodiments of the apparatus for performing three-dimensional exposure according to the present invention will be explained in detail, hereinafter, with reference to the accompanying drawings. Prior to the explanation of the present invention, the apparatus of the prior art is described in brief with reference to FIG. 12.

Figure 12:
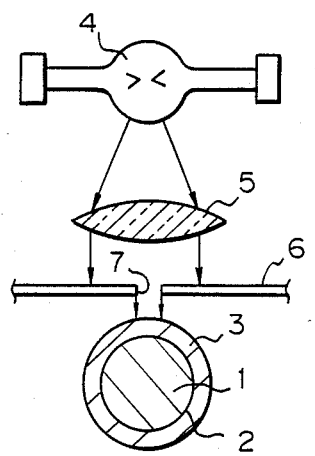
FIG. 12 is an outlined cross-sectional view showing an embodiment of the apparatus for performing three-dimensional exposure according to the prior art.

FIG. 12 is an outlined cross-sectional view showing a first embodiment of the prior art three-dimensional exposing apparatus among the above-mentioned prior art embodiments. In FIG. 12, the reference numeral 1 represents a cylindrical work for constructing an axis portion of the afore-mentioned hydrodynamic gas bearing, and a photo-sensitive coating film 2 is formed on the outer circumference of the work 1. A photo-mask 3 closely surrounds the outer circumference of the work 1 holding the photo-sensitive coating film 2 therebetween. An image to be transferred to the photo-sensitive coating film 2 is formed on the photo-mask 3. The reference numeral 4 represents a mercury-vapor lamp as an exposure light source.

Ultraviolet rays emitted from the mercury-vapor lamp 4 pass through a convex lens 5 and are converted to parallel light rays, and a part of the parallel light rays is projected onto the mask 3 through a slit 7 of a light intercepting plate 6 disposed between the convex lens 5 and the work 1. On the other hand, the work 1 rotates around the axis of the work 1 together with the photo-mask 3. The photo-sensitive coating film 2 of the work 1 is exposed in order to the photo-sensitive coating film 2 through the image of the photo-mask 3. In such a way, the image on the photo-mask 3 is transferred onto the photo-sensitive coating film 2.

In such conventional three-dimensional apparatus, since the time of exposure is long in all cases and further the preparatory works performed before exposure mainly consist of manual operation, improvement of processing accuracy for manufacturing the products needs a high degree of skill and preparatory works expend a long time. For this reason, the efficiency of such works is lowered and it results in cost-up of the products in its turn. Those matters are thought to be defects of the conventional technology.

In order to attain the afore-mentioned objects, a method of performing three-dimensional exposure according to the present invention is characterized in that the method comprises steps of:

focusing ultraviolet rays generated by a light source portion of an optical unit consisting of a light source, a lens and a reflection mirror onto a point of a first optical axis by use of a light focusing mirror;

projecting the focused ultraviolet rays on the lens portion by opening a shutter for opening and closing the path of the rays;

converting the projected ultraviolet rays to parallel light rays parallel with a second optical axis by means of the lens portion;

reflecting thereafter said parallel light rays by use of the reflection mirror and focusing the light rays onto either one of respective successive points and a predetermined point on the second optical axis; and exposing the focused ultraviolet rays on a photo-sensitive coating film of a work through a slit of a photo-mask, and the method of performing three-dimensional exposure further comprises steps of:

relatively moving the work and the optical unit along the second optical axis so as to move the work in order onto the first relative position and the second position in relation to the reflection mirror;

exposing the ultraviolet rays on the photo-sensitive coating film of the work by opening the shutter of the light source portion when the work is moved to the first relative position; and stopping exposure by closing the shutter when the work is moved to the second relative position.

An apparatus for performing three-dimensional exposure on the basis of the afore-mentioned method which has an optical unit is characterized in that the optical unit comprises:

a light source portion provided with a light source accommodated in a housing supported by a subframe and generating ultraviolet rays, a light focusing mirror for focusing the ultraviolet rays onto a point of a first optical axis, and a shutter for admitting and intersepting the ultraviolet rays by opening and closing the shutter;

a lens portion for converting the ultraviolet rays admitted at the time of opening the shutter to parallel light rays parallel with a second optical axis; and a reflection mirror having a one-axis rotatable reflection surface formed so as to rotate around the second optical axis, for reflecting the parallel light rays projected from the lens portion and focusing the reflected light rays onto either one of the successive points on the second optical axis and a predetermined point thereon, the reflection mirror further having a through-hole bored along the second optical axis, wherein the ultraviolet rays focused by the reflection mirror through a slit of a photo-mask onto a photo-sensitive coating film formed on an outer surface of a work loosely inserted into the through-hole of the reflection mirror together with a photo-mask surrounding an outer circumference of the work, and the apparatus for performing three-dimensional exposure further comprises:

a work gripping assembly for gripping the work detachably by intermediation of a work holder;

a work moving mechanism for moving at least either one of the optical unit and the work gripping assembly along the second optical axis, such that both of the optical unit and the work gripping assembly are moved relatively to each other and thereby the work is moved in order, to the first relative position and to the second relative position in relation to the reflection mirror;

a control unit for automatically driving the work moving mechanism in accordance with a predetermined program during a time period of closing an ON-OFF switch such that when the work is moved to the first relative position the shutter of the light source portion is opened and thereby the photo-sensitive coating film of the work is exposed to the ultraviolet rays, and when the work is moved to the second relative position the shutter of the light source portion is closed in order to stop exposure of the photo-sensitive coating film to the ultraviolet film;

and a main body frame for respectively supporting the subframe, the lens portion, the reflection mirror, the work gripping assembly and the work moving mechanism.

Furthermore, the other method of performing three-dimensional exposure according to the present invention is characterized in that the method comprises steps of:

focusing ultraviolet rays generated by a light source portion of an optical unit consisting of a light source, a lens and a reflection mirror onto a point of a first optical axis by use of a light focusing mirror;

projecting the focused ultraviolet rays on the lens portion by opening a shutter for opening and closing the path of the rays;

converting the projected ultraviolet rays to parallel light rays parallel with a second optical axis by means of the lens portion;

reflecting thereafter the parallel light rays by use of the reflection mirror and converting the reflected light rays to parallel light rays perpendicular to a plane containing therein the second optical axis; and exposing the reflected ultraviolet rays onto the photo-sensitive coating film of the work through the slit of the photo-mask, and the method of performing three-dimensional exposure further comprises steps of:

relatively moving the work and the optical unit along the second optical axis so as to move the work in order onto the first relative position and the second position in relation to the reflection mirror;

exposing the ultraviolet rays on the photo-sensitive coating film of the work by opening the shutter of the light source portion when the work is moved to the first relative position; and stopping exposure by closing the shutter when the work is moved to the second relative position.

An apparatus for performing three-dimensional exposure on the basis of the above-mentioned method which has an optical unit is characterized in that the optical unit comprises:

a light source portion provided with a light source accommodated in a housing supported by a subframe and generating ultraviolet rays, a light focusing mirror for focusing the ultraviolet rays onto a point of a first optical axis, and a shutter for admitting and intersepting the ultraviolet rays by opening and closing the shutter;

a lens portion for converting the ultraviolet rays admitted at the time of opening the shutter to parallel light rays parallel with a second optical axis; and reflection mirror having a one-axis rotatable reflection surface formed so as to be inclined in relation to the second optical axis, for reflecting the parallel light rays projected from the lens portion and converting the reflected light rays to parallel light rays perpendicular to a plane containing therein the second optical axis, the reflection mirror further having a through-hole bored along the second optical axis, wherein the ultraviolet rays focused by the reflection mirror through a slit of a photo-mask onto a photo-sensitive coating film formed on an outer surface of a work loosely inserted into the through-hole of the reflection mirror together with a photo-mask surrounding an outer circumference of the work, and the apparatus for performing three-dimensional exposure further comprises:

- a work gripping assembly for gripping the work detachably by intermediation of a work holder;
- a work moving mechanism for moving at least either one of the optical unit and the work gripping assembly along the second optical axis, such that both of the optical unit and the work gripping assembly are moved relatively to each other and thereby the work is moved in order, to the first relative position and to the second relative position in relation to the reflection mirror;
- a control unit for automatically driving the work moving mechanism in accordance with a predetermined program during a time period of closing an ON-OFF switch such that when the work is moved to the first relative position the shutter of the light source portion is opened and thereby the photo-sensitive coating film of the work is exposed to the ultraviolet rays, and when the work is moved to the second relative position the shutter of the light source portion is closed in order to stop exposure of the photo-sensitive coating film to the ultraviolet rays;

and

- a main body frame for respectively supporting the subframe, the lens portion, the reflection mirror, the work gripping assembly and the work moving mechanism.

The construction and its operational function of the present invention will be described concretely in detail hereinafter on the basis of embodiments shown in the drawings.

FIGS. 1 through 9 are views showing a first embodiment of the apparatus for practicing the former method of performing three-dimensional exposure according to the present invention. At first, the construction thereof will be explained hereinafter.

Figure 1:
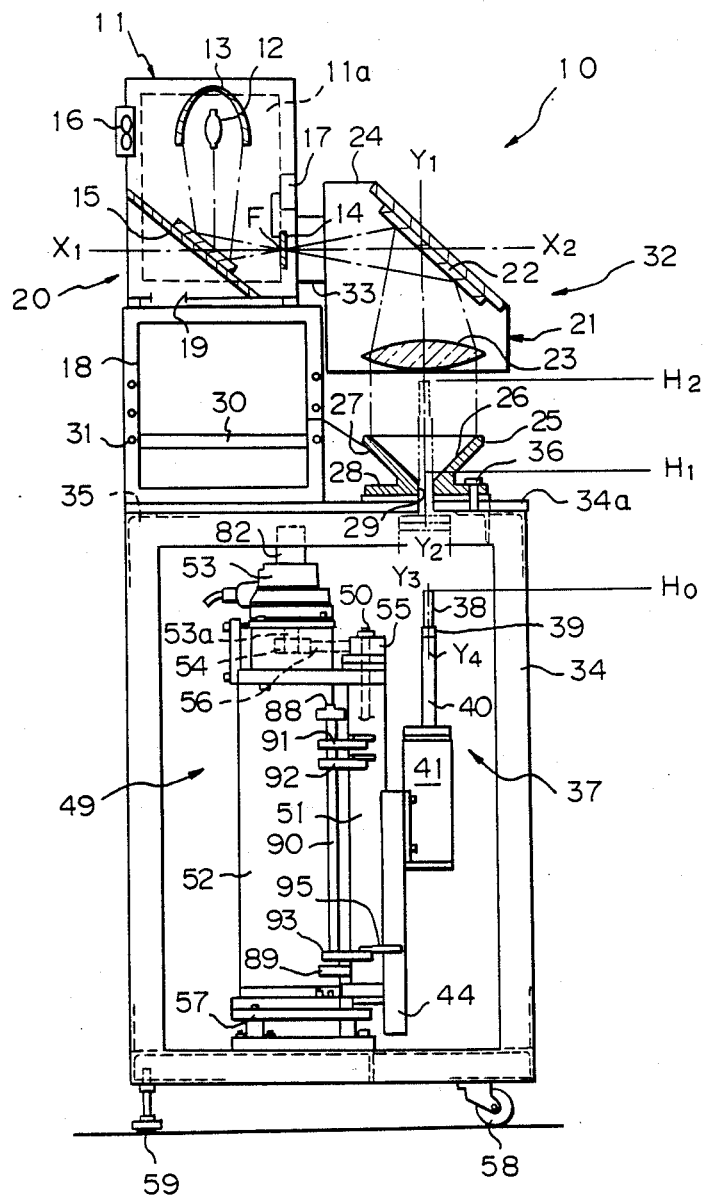
FIG. 1 is a front cross-sectional view showing a main portion of a first embodiment of the apparatus for performing three-dimensional exposure according to the present invention.

In FIG. 1, the reference numeral 11 represents a housing for accommodating an ultrahigh voltage mercury-vapor lamp 12, a light focusing mirror 13 and a shutter 14 together with a cold mirror 15, a cooling fan 16 combined with a motor not shown in FIG. 1 and a rotary solenoid 17.

The reference numeral 18 represents a sub-frame for supporting the housing 11. The ultrahigh voltage mercury-vapor lamp 12 is a light source for emitting ultraviolet rays. The ultraviolet rays emitted from the light source 12 are reflected on the concave light focusing mirror 13 and further reflected on the cold mirror 15 having an inclination angle of 45° in relation to the horizontal plane.

The reflected ultraviolet rays are focused on a point F located on a first optical axis X1–X2 in a horizontal direction as shown in FIG. 1. The shutter 14 is positioned on the point F located on the first optical axis X1–X2. The rotary solenoid 17 drives the shutter 14 so as to open and close the latter, and thereby the focused ultraviolet rays pass through the shutter 14 or the same is intercepted by the shutter 14. The cooling fan 16 breathes outer air into the housing 11 through an air inlet 19 provided at the lower part thereof. The air taken in the housing 11 cools the interior of the housing 11 heated by the ultrahigh voltage mercury-vapor lamp 12 and thereafter the air is exhausted outside of the housing 11.

And further, a light source portion 20 according to the present invention is constructed with the above-mentioned housing 11, the ultrahigh voltage mercury-vapor lamp 12, the light focusing mirror 13 and the shutter 14. The housing 11, for accommodating therein those device elements or mechanisms can be easily procured as a lump housing fitted to the objects of the present invention. In the embodiments, for instance, the output of the ultrahigh voltage mercury-vapor lamp 12 and the main wave length of the emitted ultraviolet rays are, respectively, 250 W and 365 nm.

Figure 2:
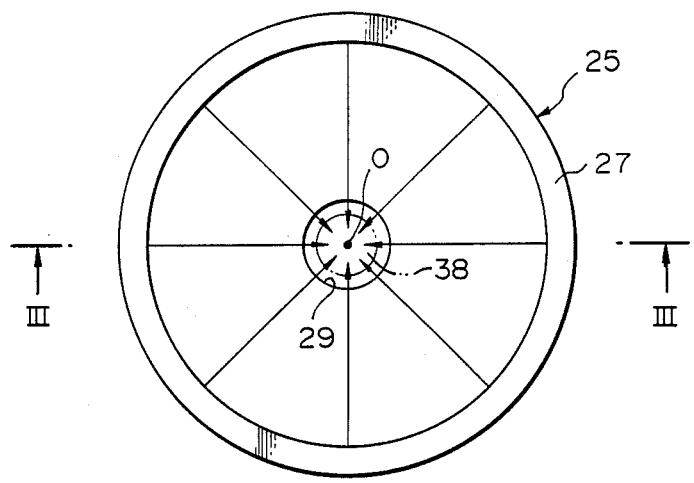
FIG. 2 is a plan view showing a reflection mirror thereof.
Figure 3:
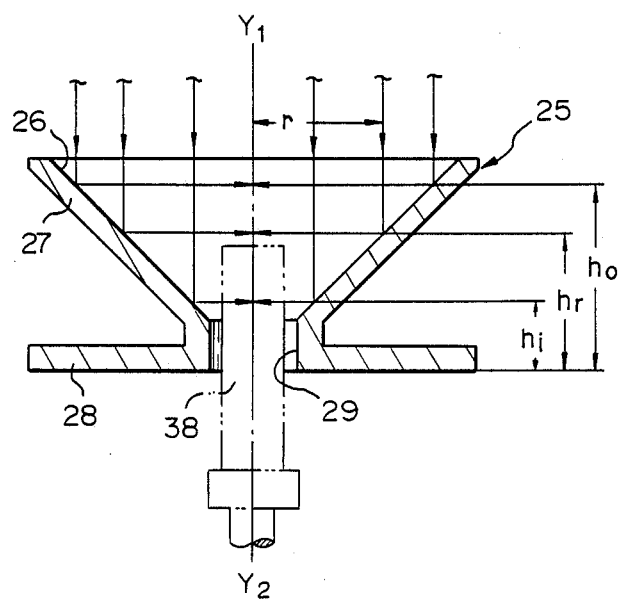
FIG. 3 is a cross-sectional view taken along the line of FIG. 2 shown by the arrow marks.

The reference numeral 21 represents a lens portion 21. The lens portion 21 comprises a plane surface mirror 22 for reflecting the ultraviolet rays projected through the opened shutter 14 of the light source portion 20 and a convex lens 23 disposed below the plane mirror 22. A housing 24 of the lens portion 21 accommodates the plane mirror 22 and the covex lens 23. The plane mirror 22 opposes to the cold mirror 15 of the light source poriton 20 and the same is inclined by 45° in relation to the horizontal surface. The ultraviolet rays reflected on the plane mirror 22 is projected on the convex lens 23 and converted to parallel light rays parallel with the second optical axis Y1–Y2 existing in the vertical direction by the convex lens 23 as shown in FIG. 1. A reflection mirror 25 is disposed below the lens portion 21. As shown in FIGS. 2 and 3, the rotation axis of the reflection mirror 25 is the second optical axis Y1–Y2. The reflection mirror 25 has a conical surface 26, the diameter of which is decreasing downward, and further the mirror 25 consists of a conical portion 27 having the conical surface opposing to the lens portion 21 and a flange portion 28 unitarily formed below the conical portion together with the same. A through-hole 29 is bored in the reflection mirror 25 along the second optical axis Y1–Y2. The through-hole 29 has a circular cross section with a center coinciding with the apex of the conical surface 26.

The conical surface 26 constructs a one-axis-rotatable reflection surface with the rotation axis coinciding with the second optical axis Y1–Y2 and the vertical angle thereof is 90°. When the parallel light rays parallel with the second optical axis Y1–Y2 is projected from the lens portion 21 onto the conical surface 26, the surface 26 reflects the projected light rays as parallel light rays parallel with the direction perpendicular to that of the second optical axis Y1–Y2 and further focused onto the respective successive points 0 on the optical axis Y1–Y2 in the reflection area of the conical surface 26. Moreover, the reflection mirror 25 can be obtained utilizing a mechanical processing technology, for instance, cutting to finish the surface thereof made of a material of brilliant aluminum alloy, by use of a biting tool of diamond attached to the ultraprecise lathe. Furthermore, since the conical surface 26 of the reflection mirror 25 is finished with a high surface-finishing precision, inconvenient scattering of the reflected light rays is suppressed and thereby a favorable reflecting performance of the reflection mirror 25 can be ensured.

TABLE 1

| Type | Radiation Diameter (mm) | Radiation Distance (mm) | Luminous Intensity (mW/cm²) | Degree of Central Light Rays Parallelism | Visual Angle | Degree of Luminous Intensity Uniformity within Radiation Diameter |
| --- | --- | --- | --- | --- | --- | --- |
| a | φ 60 | 40 | not less than 50 | within ±1° | within ±7° | within ±5% |
| b | φ 75 | 100 | not less than 33 | within ±1° | within ±6° | within ±5% |
| c | φ 90 | 122 | not less than 23 | within ±1° | within ±5° | within ±5% |
| d | φ 100 | 120 | not less than 18 | within ±1° | within ±4.5° | within ±5% |
| e | φ 110 | 149 | not less than 15 | within ±1° | within ±4° | within ±5% |
| f | φ 135 | 180 | not less than 10 | within ±1° | within ±3.5° | within ±5% |
| g | φ 165 | 215 | not less than 7 | within ±1° | within ±3° | within ±5% |
| h | φ 200 | 265 | not less than 5 | Within ±1° | within ±2.5° | within ±5% |

Hereupon, the optical characteristics of the light source portion 20 and the lens portion 21 are shown in Table 1. The column of type in Table 1 shows the type of combination consisting of the light source portion 20 and the lens portion 21. The type is classified on the basis of a radiation diameter of the parallel light rays which the lens portion 21 can project mainly depending on the outer diameter size of the convex lens 23 and a distance capable of radiating the parallel light rays mainly depending on the luminous intensity of the ultra-high voltage mercury-vapor lamp 12.

As shown in Table 1, the parallelism degree of the parallel light rays projected from the lens portion 21 is high and the uniformity degree of luminous intensity within the radiation diameter is constant and substantially equal to about 3%. Consequently, it follows that the lens portion 21 radiates parallel light rays onto the reflection mirror 25 with an approximately uniform luminous intensity.

Furthermore, in FIG. 1, an inner frame 30 for carrying thereon the housing 11 of the light source portion 20 is internally installed in a sub-frame 18 for supporting the housing 11. The inner frame 30 is moved in the sub-frame 18 in the up-and-down direction so as to adjust the up-and-down position of the inner frame 30 for projecting the focused ultraviolet rays from the light source portion 20 onto the lens portion 21. The adjusted inner frame 30 is fixed to the sub-frame 18 by use of fixing bolts 31. Namely, both of the inner frame 30 and the fixing bolts 31 function as a movement mechanism for moving the housing 11. By use of the inner frame 30 and the fixing bolts 31, the housing 11 is moved in a direction parallel with the second optical axis Y1–Y2 and fixed on a position. In such a way, the luminous intensity of the parallel light rays radiated from the reflection mirror 25 can be adjusted. Furthermore, the movement mechanism for moving the housing 11 in the up-and-down direction is not limited to the afore-mentioned combination of the inner frame 30 and the fixing bolts 31. For instance, it may be allowed to employ other equivalent mechanism in which a nut is provided below the housing 11 and a screwed shaft for threadedly engaging with the nut is installed in the sub-frame 18.

In such construction, the screwed shaft is rotated so as to move the housing 11 in the up-and-down direction. In short, any type of movement mechanism capable of moving the housing 11 in the directin parallel with that of the second optical axis Y1–Y2 may be allowed to employ. And further, an optical unit 32 of a three-dimensional exposing apparatus 10 is constructed with the light source portion 20, the lens portion 21 and the reflection mirror 25. The housing 11 for accommodating the light source portion 20 and the other housing 24 for accommodating the lens portions 21 are unitarily combined with each other by intermediation of a joint 33, and the housing 11 is supported and fixed on an upper plate 34a of a main body frame for accommodating a main body of the three-dimensional exposing apparatus 10 by use of a bolt 35 by intermediation of the sub-frame 18.

And further, a flange portion 28 of the reflection mirror 25 is fixed on the upper plate 34a of the main frame 34 by use of a bolt 36. On that occasion, the reflection mirror 25 is supported and fixed on the main body frame 34 such that the rotation axis of the conical surface 26 formed on the reflection mirror 25 is positioned so as to coincide with the second optical axis Y1–Y2.

In FIG. 1, the reference numeral 37 represents a work gripping assembly for gripping a work 38. The work gripping assembly 37 comprises a work holder 39 for gripping the work 38, a work holder rod 40 for connecting the work holder 39 with the upper end of the rod 40 and fixing the same thereto, and a support member 41 for supporting the work holder rod 40.

Figure 4:
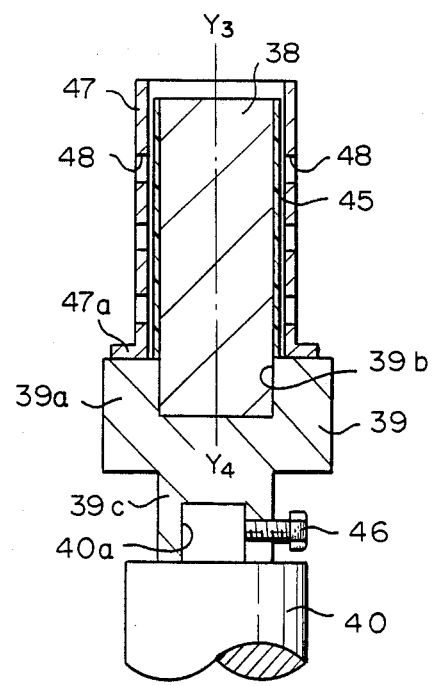
FIG. 4 is a cross-sectional view showing a state of gripping a work.

Those constructive elements of the work gripping assembly 37 are arranged in order in the up-and-down direction and the support member 41 among those constructive elements is fixed to a movement base 44. On the other hand, the work 38 gripped by the work holder 39 of the work gripping assembly 37 is, for instance, a cylindrical member constructing the axis portion of the afore-mentioned hydrodynamic gas bearing, etc., as shown in FIG. 4.

Photo-resist is coated and dried on the area from the upper end to the lower end of the circular circumferential side surface which is a part of the outer surface of the work 38, in order to form a photo-sensitive coating film 45 of a thin film state thereon. Hereupon, concerning the above-mentioned photo-resist, the one fitted to the main wave length of the ultraviolet rays radiated by the optical unit 32 or the luminous intensity thereof is selected among the goods put on the market, and the selected photo-resist is employed as the photo-sensitive coating film. The lower end portion of the work 38 is slippingly engaged with and tightly inserted into the blind hole 39b bored in the gripping portion 39a of the work holder 39.

In such construction, the work 38 is gripped by intermediation of the work holder 39 so as to be attached thereto and detached therefrom.

Furthermore, a projection 40a projecting toward the work 38 is formed on the upper portion of the work holder rod 40 for connecting the work 38 with the work gripping assembly 37. The projection 40a is tightly inserted into a connecting portion 39c of the work holder 39 and fixed thereto by a fixing screw 46. The work holder 39 can be easily replaced by the other one corresponding to the work 38 by loosening the fixing screw 46. The work holder 39 is removably mounted on the work gripping assembly 37 by intermediation of the work holder rod 40.

In FIG. 4, the reference numeral 47 represents a photo-mask surrounding the outer circumference of the work 38. For instance, an aluminum alloy is cut in a state of thinly-formed cylindrical body as the photo-mask 47 corresponding to the photo-sensitive coating film 45 of the three-dimensionally formed work 38. A plurality of slits 48 for exposing are bored on the outer circumference of the photo-mask 47. And further, since the work gripping assembly 37 is mounted in the up-and-down direction, the work gripping assembly 37 grips the work 38 by intermediation of the work holder 39 such that an axis line Y3-Y4 of the work 38 extendingly exist in the up-and-down direction. Consequently, a flange portion 47a of the photo-mask 47 is automatically brought into direct contact with the gripping portion 39a of the work holder 39 by the action of empty weight, so that the photo-mask 47 is supported by the work holder 39. Therefore, both of the work 38 and the photo-mask 47 can be easily attached to and detached from the work holder 39 without performing troublesome manipulation.

In FIG. 1, the reference numeral 49 represents a work moving mechanism for relatively moving the optical unit 32 and the work gripping assembly 37 and thereby moving the work 38 gripped by the work gripping assembly 37 in relation to the reflection mirror 25. The work moving mechanism 49 moves at least either one of the optical unit 32 and the work gripping assembly 37. In the embodiment of the present invention, the work gripping assembly 37 is moved along the second optical axis Y1-Y2.

The work moving mechanism 49 threadedly engages with the female screwed member not shown in FIG. 1 which is mounted on the movement base 44 of the work gripping assembly 37 and rotatably supports a spindle 50 extendingly-installed in the up-and-down direction by intermediation of the bearing not shown in FIG. 1. The work moving mechanism 49 comprises a bearing housing 51 extending in the up-and-down direction, a servo motor 53 fixed on the upper end portion of a stand 52, the lower end portion of which is supported by the main body frame 34, a driving pulley 54 fixed on an output shaft 53a of the servo motor 53, a dependently-moving pulley 55 fixed on a spindle 50 and a timing belt 56 wound around the driving pulley 54 and the dependently-moving pulley 55 for transmitting rotative power of the servo motor 53 to the spindle 50, as main constructive elements. And further, a ball screw not shown in FIG. 1 which is formed in the axis direction of the spindle 50 threadedly engages with the female screw member through a ball contained in the female screw member of the afore-mentioned movement base 44. When the servo motor 53 rotates and the spindle 50 is rotatably driven by the servo motor 53 by intermediation of the driving pulley 54, the timing belt 56 and the dependently-moving pulley 54, the support member 41 fixed to the movement base 44 smoothly moves along the second optical axis Y1-Y2. Furthermore, since the spindle 50 is installed such that the axis line thereof becomes parallel with the axis line of the work holder rod 40 supported by the support member 41, and further the axis line Y3-Y4 of the work 38 is coaxial with the work holder rod 40 and the axis line Y3-Y4 is coaxial with the second optical axis Y1-Y2, when the servo motor 53 of the work moving mechanism 49 is driven and thereby the work gripping assembly 37 is moved upward the work 38 passes through the through-hole 29 of the reflection mirror 25 and rises in the conical surface 26 together with the work holder 39 as shown by an imaginary line in FIG. 1. Furthermore, as shown in FIG. 3, the inner diameter of the through-hole 29 bored in the reflection mirror 25 is larger than the respective outer diameters of the work holder 39 and the work holder rod 40 shown in FIG. 4. When the work gripping assembly 37 rises, the work 38 loosely engages with the through-hole 29 together with the photo-mask 47 and the position of the conical surface 26 in the direction of the second optical axis Y1-Y2 can be changed freely.

In FIG. 1, a vibration preventing pad 57 is interposed between the lower end portion of the stand 52 installed in the work moving mechanism 49 and the main body frame 34. The vibration preventing pad 57 performs a role as a vibration preventing member for absorbing and thereby softening the vibration of the servo motor 53, the work moving mechanism 49 rotatably driven by the servo motor 53, and the work gripping assembly 37 and further preventing the optical unit 32 from vibrating and losing the functions thereof. Furthermore, in the embodiment of the present invention, the work gripping assembly 37 is supported by the work moving mechanism 49 and relatively moves in relation to the optical unit 32. The present invention is not limited to the aforementioned embodiment. For instance, even in case that the work moving mechanism 49 moves the optical unit, it may be allowed as a matter of course that the vibration preventing pad 57 is interposed between the work moving mechanism 49 and the main body frame 34. On the other hand, a plurality of casters 58 are attached to the lower portion of the main body frame 34 and such three-dimensional exposing apparatus 10 having the casters 58 can be moved easily. And further, a fixing leg portion 59 of the three-dimensional exposing apparatus 10 enables to fixedly put the apparatus 10 on the predetermined location and to adjust the horizontal position of the main body frame 34. As mentioned before, the main body frame 34 supports and fixes the sub-frame 18 of the light source portion 20, the lens portion 21 and the reflection mirror 25. The main body frame 34 further has functions of supporting the work gripping assembly 37 and the work moving mechanism 49 and putting those elements on the respective predetermined locations.

Figure 5:
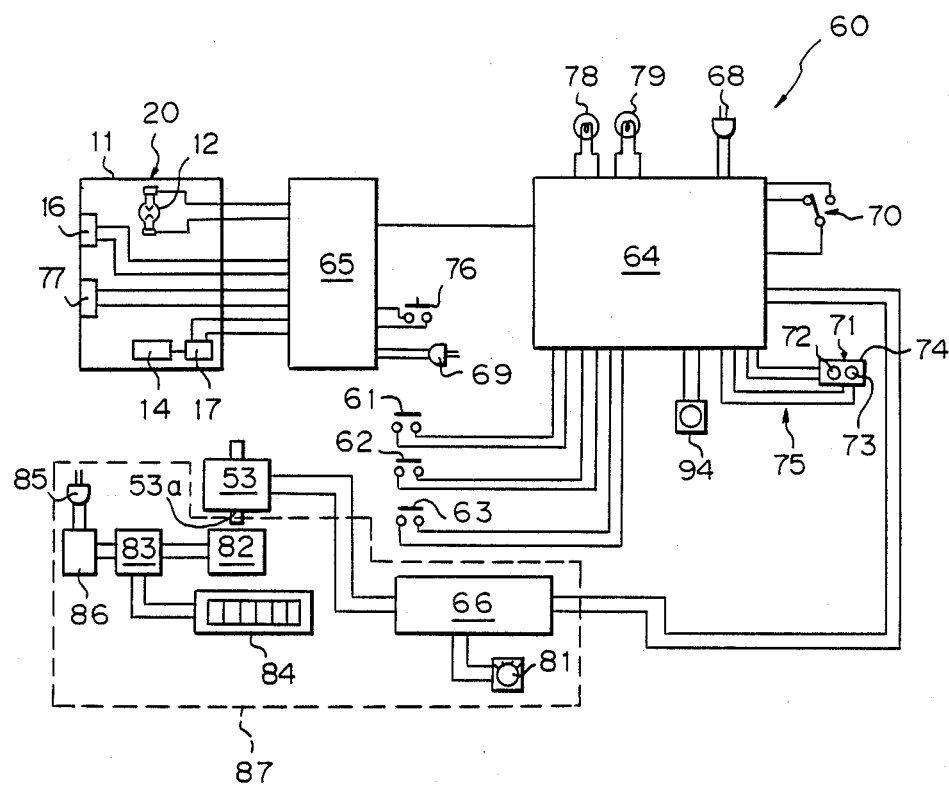
FIG. 5 is a block diagram showing an entire construction of a control unit.

FIG. 5 is a block diagram showing the entire construction of a control unit 60 for automatically driving and controlling the light source portion 20 of the optical unit 32 and the servo motor 53 of the work moving mechanism 49.

In FIG. 5, the control unit 60 is constructed with relays 61, 62 and 63 for outputting respective signals in response to the movement of the work gripping assembly 37 and a microprocessor 64 for controlling the operation of the elements in the light source portion 20 and the servo motor 53 of the work moving mechanism 49 on the basis of a predetermined program when the microprocessor 64 receives the respective signals from the relays 61, 62 and 63. The relays 61, 62 and 63 and the microprocessor 64 are the main constructive elements of the control unit 60. The microprocessor 64 is connected with the light source portion 20 through a controller 65 specially employed for the light source portion 20 and the same is connected with the servo motor 53 through a servo motor controller 66. The microprocessor 64 and the controller 65 are independently connected with power source, for instance, the AC100V power source, respectively, through the plugs 68 and 69. The microprocessor 64 is provided with a changeover switch 70 for changing over the function of the microprocessor 64 from the manual side to the automatic side or vice versa. When the switch is changed over to the automatic side, a predetermined program is automatic executed. And further, the microprocessor 64 is provided with a switch 71 for turning on and turning off the microprocessor 64. The switch 71 consists of a start switch 72 and an emergency stop switch 73, both of which are accommodated in a remote manipulation switch box 74 and installed at a place far away from the microprocessor 64.

Furthermore, the switch 71 is connected with the microprocessor 64 through the cable 75. In such construction, the microprocessor 64 can be manipulated remotely. When the start switch 72 is pushed, the respective elements of the light source portion 20 and the servo motor 53 start the respective operations in accordance with the predetermined program. As occasion demands, those elements can urgently stop the respective operations by pushing the emergency stop switch 73.

In such a way, the three-dimensional exposing apparatus 10 can be prevented from being vibrated by the external portions in addition to the effect owing to the vibration preventing pad 57 interposed between the work moving mechanism 49 and the main body frame 34. A lighting switch 76 for lighting up the ultrahigh voltage mercury-vapor lamp 12 is mounted on the controller 65. The ultrahigh voltage mercury-vapor lamp 12 is lit up or put out by turning on or turning off the lighting switch 76. And further, when the lighting switch 76 is turned off the cooling fan 16 is driven and thereby cooling air is sucked into the housing 11 through an air inlet 19 thereof as shown in FIG. 1. The reference numeral 77 represents an interlock mechanism for locking a door 11a provided for checking the interior of the housing 11 at the same time when the ultrahigh voltage mercury-vapor lamp 12 is lit up. The interlock mechanism 77 prevents the operator from being injured. Namely, even though the operator tries to open the door 11a carelessly during the time period of lighting up the ultra-high voltage mercury-vapor lamp 12, the interlock mechanism 77 locks the door 11a by the cooperative action with the lighting switch 76. Moreover, the microprocessor 64 is specially provided with display lamps 78 and 79 for displaying the state of lighting-up or putting-out of the ultrahigh voltage mercury-vapor lamp 12. The display lamp 78 displays the state of lighting up the lamp 12 when the lighting switch 76 is turned on, and the display lamp 79 displays the stable condition in the light intensity of the ultraviolet rays emitted from the ultrahigh voltage mercury-vapor lamp 12. After confirming the displays of those lamps, the microprocessor 64 is turned on by pushing the start switch 72 included in the switch portion 71.

In FIG. 5, the reference numeral 81 represents a variable resistor(volume) for setting the revolution number. The variable resister 81 is connected with the servo motor controller 66 and sets the revolutions number of the servo motor 53. On the other hand, as shown in FIG. 1, a rotary encoder 82 is attached to the servo motor 53 of the work moving mechanism 49 such that the encoder 82 opposes to the output axis 53a of the servo motor 53. When the servo motor 53 rotates, the rotary encoder 82 outputs signal. The signal is amplified by an amplifier 83 and the amplified signal is input to a speed monitor 84. In such a way, the revolutions number of the servo motor 53 which is set by the variable resistor 81 can be monitored by means of the speed monitor 84. Moreover, the amplifier 83 is connected through a plug 85 with a power source circuit 86 which is connected with, for instance, an AC100V power source.

In such circuit construction, necessary voltage and current are respectively supplied to the amplifier 83, the rotary encoder 82 and the speed monitor 84.

The variable resister 81 for setting the revolutions number, the servo controller 66, the rotary encoder 82, the amplifier 83, the speed monitor 84 and the power source circuit 86 control the revolutions number of the servo motor 53. The above-mentioned elements construct a speed control mechanism 87 for controlling the movement speed of the work gripping assembly 37 moved by the work moving mechanism 49. The movement speed with which the work moving mechanism 49 relatively moves the work gripping assembly 37 in relation to the optical unit 32 can be controlled by the speed controlling mechanism 87.

In FIG. 1, a sliding rod 90 supported by the bearing housing 51 by intermediation of brackets 88 and 89 is attached to the bearing housing 51 of the work moving mechanism 49 in parallel with the second optical axis Y1-Y2, namely, the movement direction of the work 38, and photoelectric switches 91, 92 and 93 are fixed to the sliding rod 90 in order from the top of the rod. Reflection plates 95 opposing to the respective photoelectric switches 91, 92 and 93 are fixedly attached to the side surface of the movement base 44 of the work gripping assembly 37.

When the work gripping assembly 37 is moved upward by the work moving mechanism 49, the respective reflection plates 95 reflect in order the light rays projected by the photoelectric switches 91, 92 and 93 and the respective light receiving portions respectively included in the photoelectric switches receive the respective reflected light rays and output respective signals corresponding thereto. The relays 61, 62 and 63 shown in FIG. 5 receive the signals from the photoelectric switches 91, 92 and 93, respectively, and those relays are closed by responding thereto.

And further, when the tip end of the work 38 gripped by the work gripping assembly 37 is located at the lowest position, that is, the home position H0 shown in FIG. 1, the relay 63 is closed so that the microprocessor 64 stops the rotation of the servo motor 53 and thereby the work gripping assembly 37 stops. Similarly, when the tip end of the work 38 is located at the position H1 where it begins to project into the space of the conical surface 26, the relay 62 is closed so that the rotary solenoid operates by intermediation of the microprocessor 64 and the controller 65 and thereby the shutter 14 of the light source portion 20 is opened. And finally; when the tip end of the work 38 is located at the highest position H2, the relay 61 is closed and the shutter 14 is also closed. At the same time, the servo motor 53 rotates in the reverse direction and thereby the tip end of the work 38 descends toward the home position H0. Moreover, in FIG. 5, the reference numeral 94 represents a timer included in the microprocessor 64. When the tip end of the work 38 is located at the position H1, the timer 94 begins to operate by the action of the relay 62. Namely, starting at the moment delayed from the time of closing the relay 62, the timer 94 causes the brake of the servo motor 53 not shown in FIG. 1 to operate for the purpose of smoothly performing stoppage and inversion of rotation.

Figure 6:
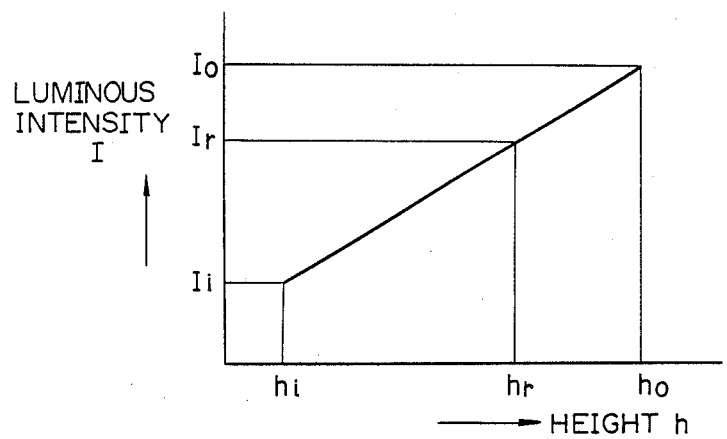
FIG. 6 is a graph showing a relationship between the height of the reflection mirror and the illumination intensity of the light rays reflected thereon.

In FIGS. 2 and 3, as mentioned before, the parallel light rays in the lens portion 21 reflected on the conical surface 26 of the reflection mirror 25 are parallel light rays proceeding in a direction perpendicular to that of the second optical axis Y1–Y2, and the same are focused onto the point 0 of the second optical axis Y1–Y2 in the reflection area of the conical surface. When the work 38 is situated in the conical surface 26, the light rays are projected onto the photo-sensitive coating film 45 of the work 38. At this time, the luminous intensity I (mW/cm$^2$) of the ultraviolet rays on the photo-sensitive coating film 45 changes depending on the heights Hi, Hr and Ho of the reflection mirror 25 from the bottom surface of the flange portion 28 unitarily formed on the reflection mirror 25. The value of the luminous intensity of the ultraviolet rays varies in proportion to the position r of the incident light rays projected onto the conical surface 26. The relationship of the luminous intensity I and the height H of the reflectin mirror is shown in FIG. 6. As shown in FIG. 6, the more the height H the more becomes the luminous intensity on the reflection mirror. The relationship can be expressed by the following equation (2) as shown below.

$$K = \frac{I}{H} \quad (2)$$

Here, $K$ is a constant.

Figure 7:
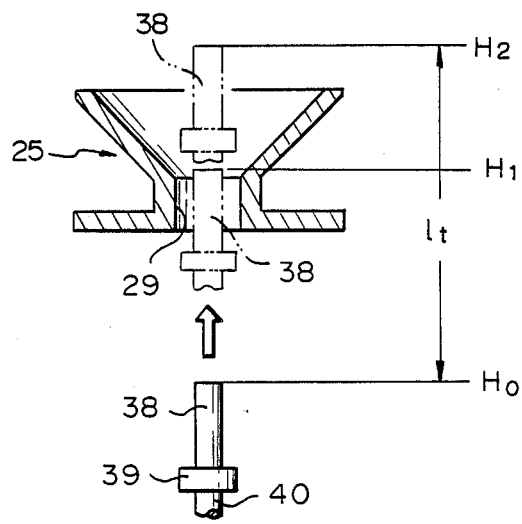
FIG. 7 is a type view showing a state of work's movement.

Consequently, supposing that the work 38 is fixed on a suitable place in the conical surface 26 of the reflection mirror 25 and when the shutter 14 of the light source portion 20 the photo-sensitive coating film is exposed to the ultraviolet rays focused by the reflection mirror 25 through the slit 48 of the photo-mask 47, the luminous intensity of the ultraviolet rays for exposing the photosensitive coating film 45 along the axis line Y3–Y4 of the work 38 varies in spite of uniform luminous distribution of the parallel light rays projected on to the reflection mirror 25. For this reason, the control unit 60 controls and drives the servo motor 53 of the work moving mechanism 49 such that the work gripping assembly 37 is moved relatively to the optical unit 32 by use of the work moving mechanism 49, and as shown in FIG. 7, the tip end portion of the work 38 projects into the conical surface so as to move to the first and second relative positions H1 and H2, in order. The first relative position H1 is located at a place where the work 38 is positioned oppositely to the reflection mirror 25 and the second position H2 is located at another place where the tip end portion of the work 38 rises up to the highest level.

Furthermore, as mentioned before, when the tip end of the work 38 is moved to the first relative position H1 the shutter 14 of the light source portion 20 is opened and the photo-sensitive coating film 45 of the work 38 is exposed to the ultraviolet rays, and further when the tip end of the work 38 is moved to the second relative position H2 the shutter 14 is closed and exposure to the light rays is stopped.

Figure 8:
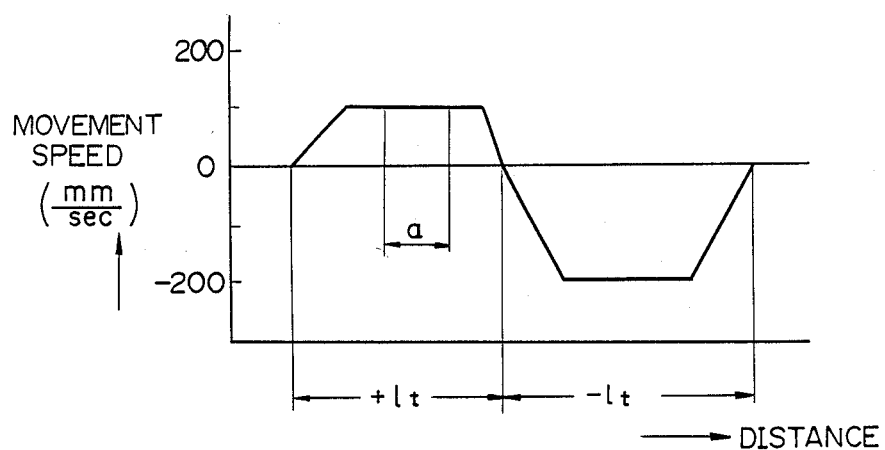
FIG. 8 is a graph showing the movement speed characteristic of a work movement mechanism.

And further, assuming that the distance between the home position H0 and the second relative position H2 both shown in FIG. 7, that is, the span of the up-and-down movement of the work 38 is set to a value Lt, when the work 38 is driven by the work moving mechanism 49 and the same reciprocatingly moves within the area of the span Lt, the movement speed thereof is the one as shown in FIG. 8. Hereupon, in FIG. 8, the positive portion of Lt represents the span of the work's movement at the time of ascending while the negative portion thereof represents that at the time of descending. And further, the work 38 rises up at a constant speed by the action of a speed control mechanism 87 of the control unit 60, and thereafter the shutter 14 of the light source portion 20 is opened or closed by the action of the control unit 60 in a constant speed area "a".

Furthermore, since the moving speed of the work 38 can be appropriately controlled by use of the speed control mechanism 87, when the photo-sensitive coating film 45 of the work 38 is exposed to the ultraviolet rays through the slit 48 of the photo-mask 47, even though the intensity of the reflected ultraviolet rays vary in the direction of the height of the reflection mirror 25 the work 38 moves so that the entire exposure energy per unit area (unit square measure) of the ultraviolet rays applied to the respective exposure portions of the photo-sensitive coating film 45 can be made uniform, as shown by the afore-mentioned equation (2). Consequently, in the present invention, the reflection mirror 25 reflects the light rays, and the distribution of the luminous intensity for illuminating the photo-sensitive coating film 45 at the time of being exposed can be made approximately uniform in total over the entire surface of the photo-sensitive coating film 45.

Next, the functional operation of the above-mentioned three-dimensional exposing apparatus 10 is explained hereinafter, on the basis of the construction thereof and, in addition, a first embodiment of the three-dimensional exposing method according to the present invention.

In FIGS. 1 and 5, when the lighting switch 76 of the control unit 60 is closed and thereby the ultrahigh voltage mercury-vapor lamp 12 is lit, a cooling fan 16 is driven by a controller 65. The cooling fan 16 cools the interior of the housing 11.

The ultraviolet rays emitted from the ultrahigh voltage mercury-vapor lamp 12 are focused by the light focusing mirror 13 and the same are reflected on the cold mirror 15 and focused onto a point F on the first optical axis X1–X2. On the other hand, as shown in FIG. 4, the work 38 is attached together with the photo-mask 47 to the work holder rod 40 of the work gripping assembly 37 through the work holder 39.

When a start switch 72 of the switch assembly 71 is closed, the servo motor 53 of the work moving mechanism 49 is driven and rotates with a revolutions number set by the revolutions number setting volume (variable resistor) 81, and thereby the spindle 50 is rotatably driven by the servo motor 53 of the work moving mechanism 49 by intermediation of the driving pulley 54, the timing belt 56 and the dependently-moving pulley 55.

At the same time, the moving base 44 is driven so as to rise up by the screwing action of the spindle 50 and the same moves upward the work gripping assembly 37 together with the work 38 so that the work 38 and the optical unit 32 are relatively moved to each other along the second optical axis Y1-Y2.

At this time, the axis line Y3-Y4 of the work 38 becomes coaxial with the second optical axis Y1-Y2, and the work 38 has been already coated with the photoresist and dried thereafter. In such a way, the photo-sensitive coating film 45 is formed thereon.

When the work 38 ascends gradually and the tip end of the work 38 arrives at the first relative position H1 in relation to the reflection mirror 25, a reflectin plate 95 mounted on the moving base 44 and employed as a photo-electric switch reflects the light rays projected from the photo-electric switch 92, and thereby the photo-electric switch 92 closes the relay 62 and causes a rotary solenoid 17 of the light source portion 20 to function through the microprocessor 64 and the controller 65 so as to open the shutter 14. Being accompanied with the above, the ultraviolet rays focused by the light source portion 20 are projected onto the lens portion 21 and reflected on the plane mirror 22 of the lens portion 21. and the same are converted to parallel light rays parallel with the second optical axis Y1-Y2 by use of the convex lens 23. The parallel light rays are further reflected on the conical surface 26 of the reflection mirror 25 and become parallel light rays perpendicular to the second optical axis Y1-Y2. At the same time, the parallel light rays are focused on each of the successive points "0" arranged on the second optical axis Y1-Y2 in the reflection area of the conical surface 26. And further, the photo-sensitive coating film 45 of the work 38 is exposed to the light rays reflected on the reflection mirror 25 through the slit 48 of the photo-mask 47 shown in FIG. 4.

On this occasion, the interval (gap) between the photo-mask 47 and the photo-sensitive coating film 45 of the work 38 is set at a value in such a range that the photo-mask 47 can be removed therefrom. Furthermore, since the gap therebetween is very small, for instance, of size ranging 3 to 200 μm, the value of the positional deviation of exposure due to the slit 48 is also very small so that the actual accuracy of exposure can be assured. Moreover, since the light rays reflected on the reflection mirror 25 incidently proceed onto the surface of the photo-sensitive coating film 45 in a direction of the normal line perpendicular thereto, the exposure latent image of very high contour accuracy, that is, very high fidelity can be formed on the photo-sensitive coating film 45. Furthermore, in the present embodiment, the photo-mask 47 to be employed is a so-called film-mask constructed with a transparent plastic film such as polyester film treated with patterning thereon. The afore-mentioned patterning is a work of coating the surface of the film with silver salt emulsion and causing a (chemical) reaction therebetween.

In such a way, when the photo-sensitive coating film 45 of the work 38 is kept to be exposed to the ultraviolet rays and then the work 38 rises up and the tip end of the work 38 moves up to the second relative position H2 in relation to the reflection mirror 25 as shown in FIG. 7, the reflection plate 95 employed for the photo-electric switch 91 and the projected light rays arrive thereat. At this time, the photo-electric switch 91 closes the relay 61 and the rotary solenoid 17 functions responding thereto, and then the same closes the shutter 14 and thereby stops exposure of the photo-sensitive coating film 45. At the same time, the servo motor 53 starts to rotate in an inverse direction and thereby the work moving mechanism 49 causes the work gripping assembly 37 to descend.

When the work 38 descends and tip end thereof arrives at the home position Ho, the reflection plate 95 employed for the photo-electric switch approaches closely to the photo-electric switch 93. And then, in a similar way, the photo-electric switch 93 closes the relay 63 and thereby the servo motor 53 stops its rotation. At this time, operation of exposing the work 38 comes to an end. And then, the work 38 is exposed in the area "a" of constant speed as shown in FIG. 8 and thereby the exposure energy per unit area (unit square measure) of the ultraviolet rays applied to the respective exposure portions of the photo-sensitive coating film 45 turns out to be uniform. Moreover, the entire surface of the photo-sensitive coating film 45 is exposed at the same time to the focused ultraviolet rays having a high energy density, and further since the exposure can be done normally to the photo-mask 47 the time period consumed for performing the work of exposure can be largely shortened. Furthermore, since the exposure light rays incidently proceed normally or almost normally toward the photo-mask 47, even though more or less gap exists between the photo-mask 47 and the photo-sensitive coating film 45, it may be possible to perform the exposure work of high accuracy. And further, the photo-mask 47 can be attached to and removed from the other in a very short period of time owing to the above-mentioned gap. Moreover, although the conventional operation of exposure needed about thirty minutes only for performing exposure on the cylindrical work 38 having a length of 80 mm, and a diameter of 14 mm, the operation of exposure according to the embodiment of the present invention needs less than twenty seconds for performing one cycle of exposue operation.

Furthermore, as shown in Table 1, since the radiation diameter of the lens portion 21 can be selectively set at a value within an area of 60 mm to 200 mm, the aperture (diameter) of the reflection mirror 25 can be set at a value within an area wider than that in the conventional case so as to correspond to various sizes and shapes of the work 38. Moreover, in the present invention, a preferably accuracy of exposure was obtained in a short period of time by use of the reflection mirror having the aperture (diameter) of 165 mm as mentioned above.

At this time, the minimum energy required for performing exposure was 30 to 40 $mJ/cm^2$.

Figure 9:
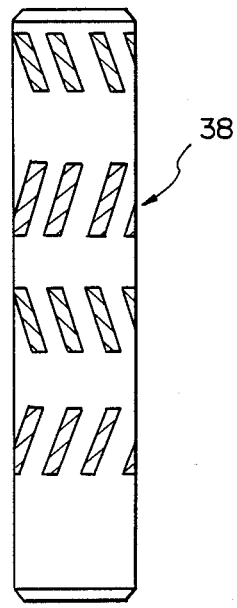
FIG. 9 is a front view showing an example of the exposed work.

Here, an example of the central shaft of the hydrodynamic gas bearing realized by the embodiment of the present invention is shown in FIG. 9. A hatched portion shown in FIG. 9 represents a shallow groove of micron order. In the present embodiment, it is possible to perform exposure in a moment.

Consequently, the mass production of the central shaft can be realized and thereby the manufacturing cost can be considerably reduced.

As mentioned heretofore, in the present embodiment, the ultraviolet rays emitted from the ultrahigh voltage mercury-vapor lamp 12 of the light source portion 20 are focused onto the second optical axis Y1-Y2 by use of the optical unit 32. And further, the shutter 14 is opened and closed, and thereby the photo-sensitive coating film 45 of the work 38 moving along the second optical axis Y1-Y2 is automatically exposed to the light rays through the slit 48 of the photo-mask 47 in the area between the first relative position H1 and the second relative position H2. For this reason, the exposure time period can be shortened, and further since the performance of exposure has been automated the unnecessary skillfullness and the consumption time for performing preparatory works can be eliminated. As a result, an improvement of exposure operation efficiency and a cost-down of product can be realized.

Moreover, in the present invention, since the time period of exposure is shortened and thereby that of opening the shutter 14 turns out to be reduced to a largest extent, the human body can be prevented from being damaged due to exposure to the ultraviolet rays before happens. And further, although the below is not shown in FIG. 9, a light rays intercepting cover is provided, between the lens portion 21 and the reflection mirror 25 in the optical unit 32, on the outer circumference of the reflection mirror 25, and in the vicinity of the lower portion of the reflection mirror 25. Especially, a perfect step is taken for preventing human eyes from being exposed to the ultraviolet rays.

Figure 10:
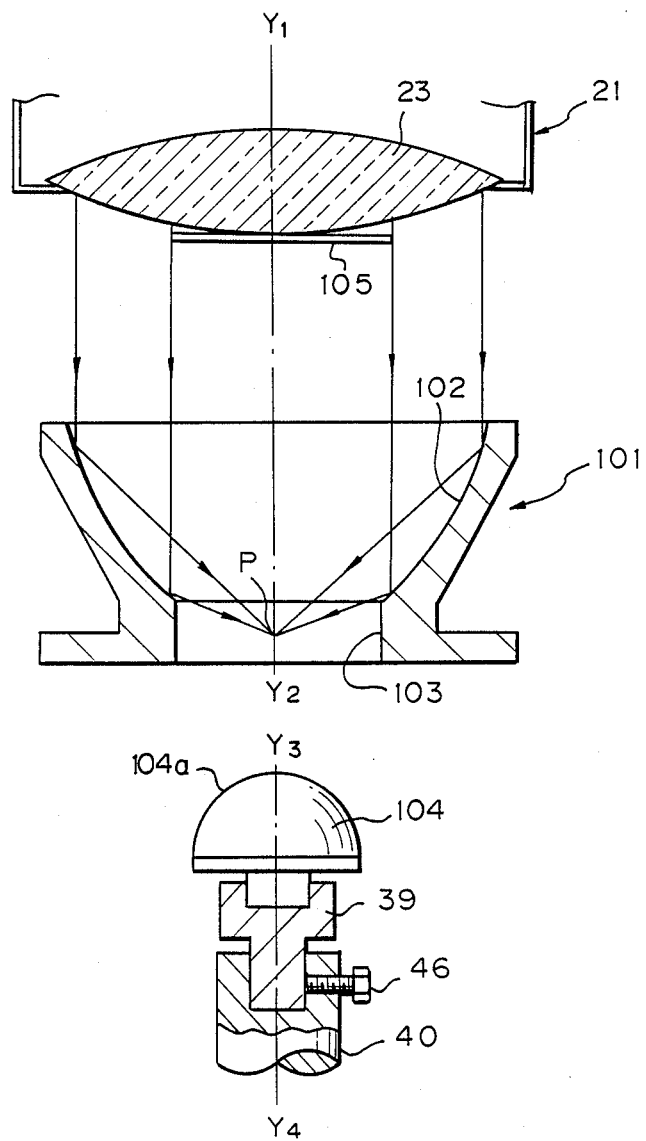
FIG. 10 is a cross-sectional view showing a main portion of a second embodiment of the apparatus for performing three-dimensional exposure according to the present invention.

FIG. 10 is a cross-sectional view showing a second embodiment of the apparatus for practicing the method of performing three-dimensional exposure according to the present invention. In FIG. 10, the reference numeral 101 represents a reflection mirror. A rotational ellipsoid surface 102 having a rotational axis coinciding with the second optical axis Y1–Y2 is formed in the reflection mirror 101. The rotational ellipsoid surface 102 constructs a reflection surface of one revolution body surface. Furthermore, a through-hole 103 having a circular cross section and an axis coinciding with the second optical axis Y1–Y2 is bored in the reflection mirror 101, and a work 104 gripped by the work holder rod 40 by intermediation of the work holder 39 rises up along the second optical axis Y1–Y2 and loosely engages with the through-hole 103. And, further, the rotational ellipsoid surface 102 of the reflection mirror 101 reflects thereon parallel light rays projected from the convex lens 23 of the lens portion 21 in a parallel with the second optical axis Y1–Y2 and focuses the same onto a predetermined point, that is, a focus P situated on the second optical axis Y1–Y2. As is the case of the first embodiment, the reflection mirror 101 can be obtained by cutting and finishing bulk material made of brilliant aluminum alloy with a monocrystal diamond bite attached to the ultraprecise lathe.

In particular, concerning the above-mentioned ultraprecise lathe, a CNC type lathe controlled by the electronic computer is adopted for the purpose of obtaining a desired elliptic curvature of the rotational ellipsoid surface 102. The work 104 has a hemispherical exposure surface 104a.

As is the case of the first embodiment, the work moving mechanism 49 not shown in FIG. 10 raises the work 104 along the second optical axis Y1–Y2 and the work 104 is exposed to the light rays. And then, by suitably controlling the movement speed of the work 104 driven by the work moving mechanism 49, the exposure energy of the ultraviolet rays can be made uniform. The exposure surface 104a of the work 104 is exposed to the ultraviolet rays.

In FIG. 10, the reference numeral 105 represents an intercepting plate which is a disk having an outer diameter a little larger than the inner diameter of the through-hole 103. The intercepting plate 105 is provided so as to stick to the reflection mirror side around the second optical axis Y1–Y2 and in a direction perpendicular thereto.

On this occasion, the parallel light rays are prevented from being directly projected onto the work 104 from the convex lens 23 so as not to make not uniform the exposure of the light rays onto the work 104, and further the central portion of the parallel light rays emitted from the convex lens 23 is intercepted by the disk 105 in order to prevent the parallel light rays from being projected onto the bored portion of the through-hole 103 of the rotational ellipsoid surface 102 (directly from the convex lens 23). Moveover, it may be a matter of course that the photo-sensitive coating film is formed on the exposure surface 104a of the work 104 and the hemispherical photo-mask is provided so as to cover the exposure surface 104a, although the explanation of the above matters is omitted in FIG. 10.

The other construction and function therof are same as those of the first embodiment of the present invention. Therefore, even in the second embodiment, the same effect as that of the first embodiment can be obtained.

Figure 11:
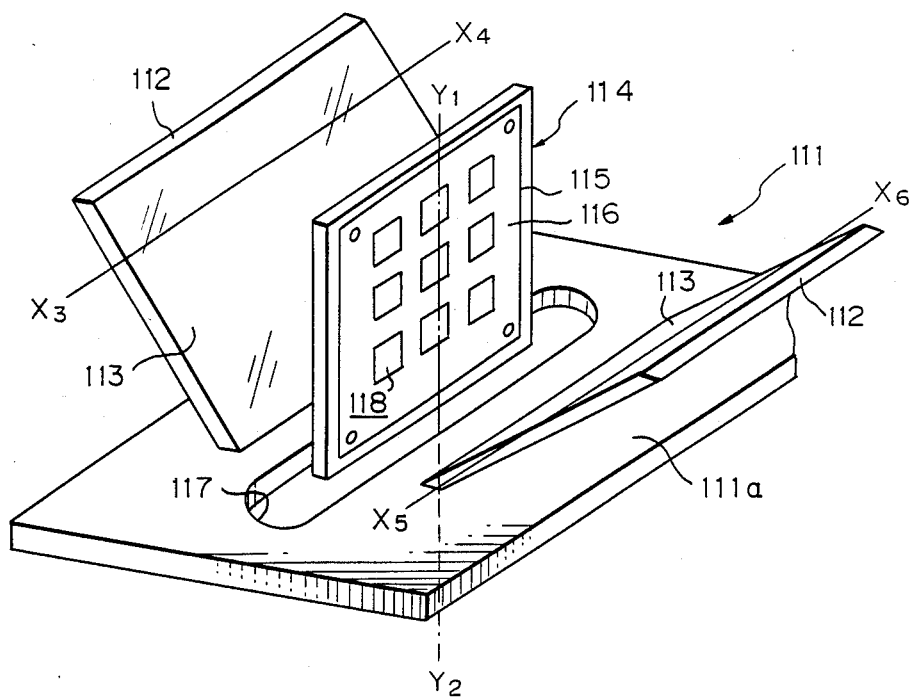
FIG. 11 is a perspective view showing a main portion of a third embodiment of the apparatus for performing three-dimensional exposure according to the present invention.

Next, FIG. 11 is a perspective view showing a third embodiment of the apparatus for practicing the method of performing three-dimensional exposure according to the present invention.

The third embodiment is the one corresponding to the status of the work different from that of the first and second embodiments of the afore-mentioned three-dimensional exposing apparatus according to the present invention.

In FIG. 11, a pair of plane mirrors 112 are provided in the reflection mirror 111. Those plane mirrors 112 are symmetrical in relation to the second optical axis Y1–Y2 and oppose to each other, and the included angles formed by the respective reflection surfaces 113 of the plane mirrors 112 and the second optical axis Y1–Y2 are equal to 45°, respectively.

Furthermore, straight lines X3–X4 and X5–X6 are respectively provided on the respective surfaces of the plane mirrors 112. Those straight lines X3–X4 and X5–X6 are perpendicular to the second optical axis Y1–Y2 and parallel with other. Namely, the reflection mirror 111 has the reflection surfaces 113 respectively inclinedly provided in relation to the second optical axis Y1–Y2, and the same is constructed such that the parallel light rays projected from the lens portion 21 are respectively reflected on the respective reflective surfaces 113 of the plane mirrors 112 and the reflectd light rays become the parallel light rays intersecting normally to the plane surface involving therein the second optical axis Y1–Y2.

The reference numeral 114 represents a work in a state of a flat board. The photo-sensitive coating film 115 is formed on the both surfaces of the work, and further the photo-mask 116 is provided so as to cover the photo-sensitive coating film 115 on the flat board. Moreover, unitarily formed flange portion 111a of the reflection mirror 111 for fixing thereon the plane mirrors 112 has a through-hole 117 corresponding to the shape of the work 114 which is bored along the second optical axis Y1–Y2. The flange portion 111a is gripped by the work moving mechanism 49 not shown in FIG. 11 and the work 114 is moved up and down along the second optical axis Y1–Y2. The other construction and function thereof are same as those of the first embodiment according to the present invention. Therefore, the same effect as that of the first embodiment can be obtained. Moreover, in case that the work 114 has the exposure surface only on one surface thereof, it is a matter of course that one of the plane mirrors 112 is omitted.

The reference numeral 118 represents a plurality of slits formed on the photo mask.

As is apparent from the foregoing description, according to the present invention, the ultraviolet rays emitted from the light source are focused on the second optical axis and an automatic exposure on the photo-sensitive coating film of the work moving along the second optical axis is performed in the area between the first relative position and the second relative position through the slits of the photo-mask by opening and closing the shutter. For this reason, the time period of exposure is shortened, and further since the operation of exposure is automated the skillfullness and the consumption of time for performing unnecessary preparatory works. Consequently, both of improvement of the exposure operation efficiency and cost-down of products can be attained.

What is claimed is:

1. A method of performing three-dimensional exposure comprising steps of:

focusing ultraviolet rays generated by a light source portion of an optical unit consisting of a light source, a lens and a reflection mirror onto a point of a first optical axis by use of a light focusing mirror:

projecting said focused ultraviolet rays on said lens portion by opening a shutter for opening and closing the path of said rays;

converting said projected ultraviolet rays to parallel light rays parallel with a second optical axis by means of said lens portion;

reflecting thereafter said parallel light rays by use of said reflection mirror and focusing said light rays onto either one of respective successive points and a predetermined point on said second optical axis; and exposing said focused ultraviolet rays on a photo-sensitive coating film of a work through a slit of a photo-mask, said method of performing three-dimensional exposure further comprising steps of:

relatively moving said work and said optical unit along said second optical axis so as to move said work in order onto said first relative position and said second position in relation to said reflection mirror;

exposing said ultraviolet rays on said photo-sensitive coating film of said work by opening said shutter of said light source portion when said work is moved to said first relative position; and stopping exposure by closing said shutter when said work is moved to said second relative position.

2. An apparatus for performing three-dimensional exposure having an optical unit, said optical unit comprising:

a light source portion provided with a light source accommodated in a housing supported by a subframe and generating ultraviolet rays, a light focusing mirror for focusing said ultraviolet rays onto a point of a first optical axis, and a shutter for admitting and intersepting said ultraviolet rays by opening and closing said shutter;

a lens portion for converting said ultraviolet rays admitted at the time of opening said shutter to parallel light rays parallel with a second optical axis; and a reflection mirror having a one-axis rotatable reflection surface formed so as to rotate around said second optical axis, for reflecting said parallel light rays projected from said lens portion and focusing said reflected light rays onto either one of said successive points on said second optical axis and a predetermined point thereon, said reflection mirror further having a through-hole bored along said second optical axis, wherein said ultraviolet rays focused by said reflection mirror through a slit of a photo-mask onto a photo-sensitive coating film formed on an outer surface of said work loosely inserted into said through-hole of said reflection mirror together with a photo-mask surrounding an outer circumference of said work, said apparatus for performing three-dimensional exposure further comprising:

a work gripping assembly for gripping said work detachably by intermediation of a work holder;

a work moving mechanism for moving at least either one of said optical unit and said work gripping assembly along said second optical axis, such that both of said optical unit and said work gripping assembly are moved relatively to each other and thereby said work is moved in order, to said first relative position and to said second relative position in relation to said reflection mirror;

a control unit for automatically driving said work moving mechanism in accordance with a predetermined program during a time period of closing an ON-OFF switch such that when said work is moved to said first relative position said shutter of said light source portion is opened and thereby said photo-sensitive coating film of said work is exposed to said ultraviole rays, and when said work is moved to said second relative position said shutter of said light source portion is closed in order to stop exposure of said photo-sensitive coating film to said ultraviolet film;

and a main body frame for respectively supporting said subframe, said lens portion, said reflection mirror, said work gripping assembly and said work moving mechanism.

3. A method of performing three-dimensional exposure comprising steps of:

focusing ultraviolet rays generated by a light source portion of an optical unit consisting of a light source, a lens and a reflection mirror onto a point of a first optical axis by use of a light focusing mirror;

projecting said focused ultraviolet rays on said lens portion by opening a shutter for opening and closing the path of said rays;

converting said projected ultraviolet rays to parallel light rays parallel with a second optical axis by means of said lens portion;

reflecting thereafter said parallel light rays by use of said reflection mirror and converting said reflected light rays to parallel light rays perpendicular to a plane containing therein said second optical axis; and exposing said reflected ultraviolet rays onto said photo-sensitive coating film of said work through the slit of said photo-mask, said method of performing three-dimensional exposure further comprising steps of:

relatively moving said work and said optical unit along said second optical axis so as to move said work in order onto said first relative position and said second position in relation to said reflection mirror;

exposing said ultraviolet rays on said photo-sensitive coating film of said work by opening said shutter of said light source portion when said work is moved to said first relative position; and stopping exposure by closing said shutter when said work is moved to said second relative position.

4. An apparatus for performing three-dimensional exposure having an optical unit, said optical unit comprising:

a light source portion provided with a light source accommodated in a housing supported by a subframe and generating ultraviolet rays, a light focusing mirror for focusing said ultraviolet rays onto a point of a first optical axis, and a shutter for admitting and intersepting said ultraviolet rays by opening and closing said shutter;

a lens portion for converting said ultraviolet rays admitted at the time of opening said shutter to parallel light rays parallel with a second optical axis; and a reflection mirror having a one-axis rotatable reflection surface formed so as to be inclined in relation to said second optical axis, for reflecting said parallel light rays projected from said lens portion and converting said reflected light rays to parallel light rays perpendicular to a plane containing therein said second optical axis, said reflection mirror further having a through-hole bored along said second optical axis, wherein said ultraviolet rays focused by said reflection mirror through a slit of a photo-mask onto a photo-sensitive coating film formed on an outer surface of a work loosely inserted into said through-hole of said reflection mirror together with a photo-mask surrounding an outer circumference of said work, said apparatus for performing three-dimensional exposure further comprising:

a work gripping assembly for gripping said work detachably by intermediation of a work holder;

a work moving mechanism for moving at least either one of said optical unit and said work gripping assembly along said second optical axis, such that both of said optical unit and said work gripping assembly are moved relatively to each other and thereby said work is moved in order, to said first relative position and to said second relative position in relation to said reflection mirror;

a control unit for automatically driving said work moving mechanism in accordance with a predetermined program during a time period of closing an ON-OFF switch such that when said work is moved to said first relative position said shutter of said light source portion is opened and thereby said photo-sensitive coating film of said work is exposed to said ultraviolet rays, and when said work is moved to said second relative postion said shutter of said light source portion is closed in order to stop exposure of said photo-sensitive coating film to said ultraviolet film;

and a main body frame for respectively supporting said subframe, said lens portion, said reflection mirror, said work gripping assembly and said work moving mechanism.

5. An apparatus for performing three-dimensional exposure as defined in claims 2 or 4, in which said light source for generation said ultraviolet rays is an ultrahigh-voltage mercury-vapor lamp.

6. An apparatus for performing three-dimensional exposure as defined in claims 2 or 4, in which said lens portion comprises a convex lens, said convex lens converting said ultraviolet rays projected from said light source portion to parallel light rays parallel with said second optical, and said parallel rays being radiated with an approximately uniform distribution of illumination intensity.

7. An apparatus for performing three-dimensional exposure as defined in claim 6, in which a circular light-intercepting plate is disposed at the side of said reflection mirror of said convex lens, a through-hole portion bored on said reflection mirror being prevented from projecting said parallel light rays onto said through-hole portion.

8. An apparatus for performing three-dimensional exposure as defined in claims 2 or 4, in which said subframe for supporting said housing of said light source portion comprises a movement mechanism, and said housing is moved in parallel with said second optical axis by said movement mechanism so as to adjust the illumination intensity of said parallel light rays radiated by said reflection mirror.

9. An apparatus for performing three-dimensional exposure as defined in claim 2, in which said one-axis rotatable reflection surface of said reflection mirror is made in a state of a conical surface, and said parallel light rays projected from said lens portion is reflected thereon and focussed on said respective successive points on said second optical axis.

10. An apparatus for performing three-dimensional exposure as defined in claim 2, in which said one-axis-rotatable reflection surface of said reflection mirror is made in a state of a rotated ellipsoidal surface, and said parallel light rays projected from said lens portion are reflected thereon and focused onto a predetermined point on said second optical axis.

11. An apparatus for performing three-dimensional exposure as defined in claim 2, in which said reflection light rays focused onto said respective successive points on said second optical axis by use of said reflection mirror are parallel light rays, and when said photo-sensitive coating film of said work is exposed to the light rays the distribution of illumination intensity for radiating said parallel light rays onto said photo-sensitive coating film is made approximately uniform over the entire area of said photo-sensitive coating film.

12. An apparatus for performing three-dimensional exposure as defined in claim 2, in which said work gripping assembly grips said work by intermediation of said work holder so as to prolong the axis line of said work in an up-and-down direction, and said assembly is supported by said work holder by the action of empty weight of said photo-mask.

13. An apparatus for performing three-dimensional exposure as defined in claims 2 or 4, in which, in said work gripping assembly, a work holder rod is installed in order to connect said work holder rod so as to project toward said work holder, and said work holder can be detachably combined with said work gripping assembly by tightly inserting said projecting portion into said work holder.

14. An apparatus for performing three-dimensional exposure as defined in claims 2 or 4, in which a vibration-proof member is disposed between said work moving mechanism and a main body frame.

15. An apparatus for performing three-dimensional exposure as defined in claims 2 or 4, in which switches of said control unit consist of a motive power starting switch and an emergency stop switch, both of said switches are disposed at a place separated from said control unit and connected therewith through connection cables so as to enable to perform a remote manipulation.

16. An apparatus for performing three-dimensional exposure as defined in claims 2 or 4, in which said control unit comprises a speed control mechanism, said speed control mechanism controls the speed of relatively moving said optical unit and said work gripping assembly by intermediation of said work moving mechanism.

17. An apparatus for performing three-dimensional exposure as defined in claim 16, in which a speed control mechanism of said control unit relatively moves said optical unit and said work gripping assembly at a constant speed by intermediation of said work moving mechanism, and during a time period of moving at a constant speed said control unit opens and closes said shutter of said light source portion so as to expose said photo-sensitive coating film of said work to said ultraviolet rays.

18. An apparatus for performing three-dimensional exposure as defined in claim 16, in which the relative movement speed of said optical unit said work gripping assembly is controlled by said speed control mechanism of said control unit, and when said photo-sensitive coating film of said work is exposed to said ultraviolet rays through said slit of said photo-mask the exposure energy per unit square measure of said ultraviolet applied to respective exposing portions of said photo-sensitively coating film is uniform.

19. An apparatus for performing three-dimensional exposure as defined in claim 4, in which said work is formed in a shape of a flat plate and exposed to light rays reflected on flat plate mirror.

20. An apparatus for performing three-dimensional exposure as defined in claim 19, in which said work has a single exposure surface and is exposed to light rays reflected on said flat-plate mirror constructed with a single mirror.

21. An apparatus for performing three-dimensional exposure as defined in claim 19, in which said work has exposure surfaces on both sides thereof and said exposure surfaces are exposed to light rays reflected on said flat-plate mirror constructed with a couple of mirrors.

* * * * *